(12) United States Patent
Liskow

(10) Patent No.: US 11,166,391 B2
(45) Date of Patent: Nov. 2, 2021

(54) ELECTRONIC MODULE AND COMBINATION OF AN ELECTRONIC MODULE AND A HYDRAULIC PLATE

(71) Applicant: Robert Bosch GmbH, Stuttgart (DE)

(72) Inventor: Uwe Liskow, Shanghai (CN)

(73) Assignee: Robert Bosch GmbH, Stuttgart (DE)

( * ) Notice: Subject to any disclaimer, the term of this patent is extended or adjusted under 35 U.S.C. 154(b) by 30 days.

(21) Appl. No.: 16/627,975

(22) PCT Filed: May 14, 2018

(86) PCT No.: PCT/EP2018/062389
§ 371 (c)(1),
(2) Date: Dec. 31, 2019

(87) PCT Pub. No.: WO2019/007573
PCT Pub. Date: Jan. 10, 2019

(65) Prior Publication Data
US 2020/0221591 A1    Jul. 9, 2020

(30) Foreign Application Priority Data

Jul. 6, 2017    (DE) ...................... 10 2017 211 513.0

(51) Int. Cl.
| | |
|---|---|
| *H05K 5/00* | (2006.01) |
| *G01L 19/14* | (2006.01) |
| *H05K 3/28* | (2006.01) |
| *H05K 5/02* | (2006.01) |
| *H05K 5/06* | (2006.01) |

(52) U.S. Cl.
CPC .......... *H05K 5/0082* (2013.01); *G01L 19/147* (2013.01); *H05K 3/284* (2013.01);
(Continued)

(58) Field of Classification Search
CPC .......... H05K 1/02; H05K 1/0207; H05K 5/00; H05K 5/0082; H05K 5/065; H05K 7/1205;
(Continued)

(56) References Cited

U.S. PATENT DOCUMENTS

| | | | |
|---|---|---|---|
| 6,523,399 B2* | 2/2003 | Fritzsche ............ | F16H 61/0009 73/115.02 |
| 10,925,193 B2* | 2/2021 | Michel ............... | H05K 7/20854 |

(Continued)

FOREIGN PATENT DOCUMENTS

| | | |
|---|---|---|
| CN | 101361182 A | 2/2009 |
| DE | 198 34 212 A1 | 2/2000 |

(Continued)

OTHER PUBLICATIONS

International Search Report corresponding to PCT Application No. PCT/EP2018/062389, dated Aug. 28, 2018 (German and English language document) (5 pages).

*Primary Examiner* — Tuan T Dinh
(74) *Attorney, Agent, or Firm* — Maginot, Moore & Beck, LLP

(57) ABSTRACT

An electronic module, more particularly a control module or sensor module for a motor vehicle transmission, has a circuit board having a first side and a second side facing away from the first side, electronic components arranged on the first side, and a casting compound arranged on the first side. The casting compound covers the electronic components. The circuit board has a through-hole connecting the first side to the second side. A sensor element covering the through-hole is arranged on the first side of the circuit board.

7 Claims, 3 Drawing Sheets

(52) U.S. Cl.
CPC ........... _H05K 5/0204_ (2013.01); _H05K 5/064_ (2013.01); _H05K 2201/10409_ (2013.01)

(58) Field of Classification Search
CPC .. H05K 7/20; H05K 7/20463; H05K 7/20854; H01F 27/02; H01F 27/292; H01R 12/52; H01R 12/58; G05F 1/575
USPC ........ 361/680–710, 765–767, 775–778, 803; 439/70; 174/350, 520; 257/685, 257/787–790
See application file for complete search history.

(56) References Cited

U.S. PATENT DOCUMENTS

| | | | |
|---|---|---|---|
| 2001/0011478 A1 | 8/2001 | Albert et al. | |
| 2004/0134549 A1* | 7/2004 | Albert | H05K 7/20254 137/884 |
| 2006/0077643 A1* | 4/2006 | Mayuzumi | H05K 3/284 361/753 |
| 2008/0157301 A1 | 7/2008 | Ramakrishna et al. | |
| 2010/0097775 A1* | 4/2010 | Kashiwazaki | H05K 3/284 361/783 |
| 2015/0039669 A1* | 2/2015 | Dupree | H04L 67/10 709/201 |
| 2017/0006711 A1* | 1/2017 | Liskow | H05K 1/0206 |
| 2017/0367200 A1* | 12/2017 | Albert | H05K 5/065 |

FOREIGN PATENT DOCUMENTS

| | | |
|---|---|---|
| DE | 10 2011 085 629 A1 | 5/2013 |
| DE | 10 2013 205 155 A1 | 9/2014 |
| DE | 10 2015 209 191 A1 | 8/2016 |
| DE | 10 2015 205 445 A1 | 9/2016 |
| WO | 2017/071860 A1 | 5/2017 |

* cited by examiner

ELECTRONIC MODULE AND COMBINATION OF AN ELECTRONIC MODULE AND A HYDRAULIC PLATE

This application is a 35 U.S.C. § 371 National Stage Application of PCT/EP2018/062389, filed on May 14, 2018, which claims the benefit of priority to Serial No. DE 10 2017 211 513.0, filed on Jul. 6, 2017 in Germany, the disclosures of which are incorporated herein by reference in their entirety.

BACKGROUND

In motor vehicle engineering, electronics modules for controlling a transmission are installed on or in the transmission. The electronics modules can be designed, for example, as transmission control modules and, apart from a control circuit which is arranged on a printed circuit board, can, for example, additionally also have connector parts, sensors and contact-making interfaces to actuators. The electronic control circuit and has to be protected from the aggressive transmission fluid. Potting compounds, which are applied to the printed circuit board in order to protect the electronic control circuit, are also used for this purpose.

For example, the DE 10 2011 085 629 A1 discloses an electronic transmission control module which has a metallic cup-type housing and has a circuit carrier which is arranged in the cup-type housing and is populated with electronic components. For the purpose of protection from the aggressive transmission fluid and metal chips contained therein, the circuit carrier is potted in the cup-type housing using a potting compound. The connection elements protrude out of the potting compound and serve partly for connection to the voltage supply, to an EC motor, to sensors and/or to a LIN or CAN bus. The cup-type housing can be fastened to a housing part of the transmission or of the transmission hydraulics system by means of screwable fastening means, it being possible for the cooling of the control device to also be performed by means of said housing part.

Furthermore, DE 10 2013 205 155 A1 discloses installing a pill-like pressure sensor element in a plastic carrier and making electrical contact with said pill-like pressure sensor element there by way of a leadframe which is embedded in the plastic carrier. This assembly is fixed on a carrier plate of a transmission control module. During operation, the plastic component relaxes, this being compensated for by mechanical prestressing of the system. In this case, the position of the pressure sensor is fixedly prespecified and cannot be changed without changing the overall design in a complicated manner.

DE 10 2015 205 445 also discloses a transmission control device with a central module which comprises a carrier plate and electronic components, which are arranged on the carrier plate, and a potting compound as a covering for the electronic components, wherein the central module has a bush with an opening for receiving a screwable fastening means in order to fasten the central module to the transmission.

SUMMARY

The disclosure relates to an electronics module, in particular a control module or a sensor module for a transmission, comprising a printed circuit board which has a first side and a second side which is averted from said first side, comprising electronic components which are arranged on the first side and comprising a potting compound which is arranged on the first side and covers the electronic components. The disclosure proposes that the printed circuit board has an aperture which connects the first side to the second side, and that a sensor element, which covers the aperture, is arranged on the first side of the printed circuit board.

Furthermore, the disclosure relates to a combination of an electronics module of this kind with a hydraulic plate, wherein the electronics module, by way of the second side of the printed circuit board, bears flat against a surface of the hydraulic plate and the hydraulic plate has a medium channel which issues at the surface, wherein the medium channel is fluidically connected to the sensor element.

In the electronics module according to the disclosure, the position of a sensor element in the electronics module can advantageously be changed and matched to the respective requirement profile without a great deal of expenditure. Therefore, when changes in the design of the position of the sensor element on the electronics module are required, this change can be implemented in a very short time. In the event of a change in design, it is advantageously only necessary for the printed circuit board layout in respect of the position of the aperture and of the electrical connections of the sensor element to be adapted. A separate plastic carrier for arranging the sensor element is advantageously not required and the costs of a plastic carrier of this kind do not apply. Similarly, the difficulties which are associated with the different thermal expansion of the plastic carrier and the printed circuit board do not apply either. The sensor element, for example a pressure sensor element, is arranged in a simple manner on the first side of the printed circuit board in such a way that it covers an aperture, which is provided for supplying the measuring medium, there. The printed circuit board is not subject to mechanical loading by the installation of the sensor element and in the event of loading of the sensor element with hydraulic pressure, as a result of which the risk of damage is avoided.

The installation of the sensor element can be performed before or after electronic components are fitted and soldered onto the printed circuit board. In the latter case, at high soldering temperatures of a soldering furnace which are required, for example, for soldering lead-free solder, the furnace temperature advantageously does not lead to melting of the solder connections in the sensor element itself.

Advantageous refinements and developments of the disclosure are rendered possible by the features contained in the dependent claims.

The sensor element can advantageously completely cover the aperture and be covered by the potting compound on the first side of the printed circuit board, as a result of which the sensor element is arranged on the electronics module in a mechanically stable manner and is adequately protected from the aggressive transmission fluid and metal chips contained therein. Advantageously, no fastening screws or rivets, which would require surface area and free space on the printed circuit board, are required for securing the sensor element to the printed circuit board. Owing to the use of a potting compound, for example a thermosetting material, for mechanically securing the sensor element, no relaxation occurs in the event of temperature fluctuations and aging of the electronics module, and therefore the position of the sensor element on the electronics module advantageously does not change in the event of compressive loading and aging of the electronics module.

Electrical connecting means, which electrically connect the sensor element to the printed circuit board, can advantageously be embedded into the potting compound. The electrical connecting means between the sensor element and the printed circuit board can be formed, for example, by means of cable connections, leadframes or flexible printed circuit boards (FPC) composed of polyimide or FR4 material. On account of being embedded in the potting compound, the electrical connecting means are protected against short circuits, which can be produced by metal chips in the transmission fluid, and against chemical loading phenomena.

The sensor element can advantageously be inserted into the aperture, as a result of which relaxation-free installation which manages without springs and minimizes compressive and tensile loading phenomena of the printed circuit board is achieved. For this purpose, the sensor element can advantageously have a circumferential collar which rests on the first side of the printed circuit board at the edge of the aperture. In one of the last production steps of the electronics module, the sensor element can be fitted to the printed circuit board by simple insertion and electrical contact can be made with said sensor element at the same time.

If the sensor element which is arranged on the first side of the printed circuit board has a relatively large structural height, a frame part, which surrounds the sensor element and within which the potting compound is applied to the first side of the printed circuit board with a greater filling level than in a region outside the frame part, can advantageously be arranged there. In this context, the filling level is understood to mean the material thickness or thickness of the potting compound in a direction perpendicular to the first side of the printed circuit board.

At least one bush for receiving a screwable connecting means can advantageously be arranged on the printed circuit board for the purpose of mechanically securing the electronic electronics module to a transmission component, wherein the bush is flanked in a circumferential manner by the potting compound, which is applied to the first side of the printed circuit board, and has an end side which is not covered by the potting compound and from which a receiving opening extends as far as the second side of the printed circuit board. This advantageously has the effect that a screwable connecting means which is inserted into the receiving opening, when it is tightened, transmits the clamping force to the end side of the bush. In turn, the bush can be directly supported on the transmission component on the second side of the printed circuit board, so that introduction of forces onto the printed circuit board is avoided when the screw is tightened. When a hydraulic pressure is applied, the sensor element is subject to a compressive force. Since the sensor element is fixedly installed on the electronic electronics module, this force is advantageously absorbed by the screwed-on bushes. Here, the printed circuit board is advantageously not subject to any impermissibly high pressing or tensile forces. It goes without saying that a plurality of bushes can also be provided on the electronics module.

Furthermore, a combination of the described electronics module with a hydraulic plate is advantageous, wherein the electronics module, by way of the second side of the printed circuit board, bears flat against a surface of the hydraulic plate and the hydraulic plate has a medium channel which issues at the surface of the hydraulic plate, wherein the medium channel is fluidically connected to the sensor element. The medium can be a gas or a liquid, and in particular transmission fluid.

For the purpose of sealing off the medium channel, provision can advantageously be made in a simple manner for the medium channel to have a projection on which a sealing ring is arranged, said sealing ring being pressed in between a section of the sensor element which protrudes into the aperture and the projection.

DETAILED DESCRIPTION

The electronics module may be, for example, a control module for controlling an assembly or may be a sensor module with a plurality of sensors. In particular, said electronics module is a transmission control module or a sensor module for a transmission.

The design of an electronics module 1, illustrated in FIG. 1, will be described below with reference to the production method illustrated in FIG. 2 to FIG. 4.

Figure 2:
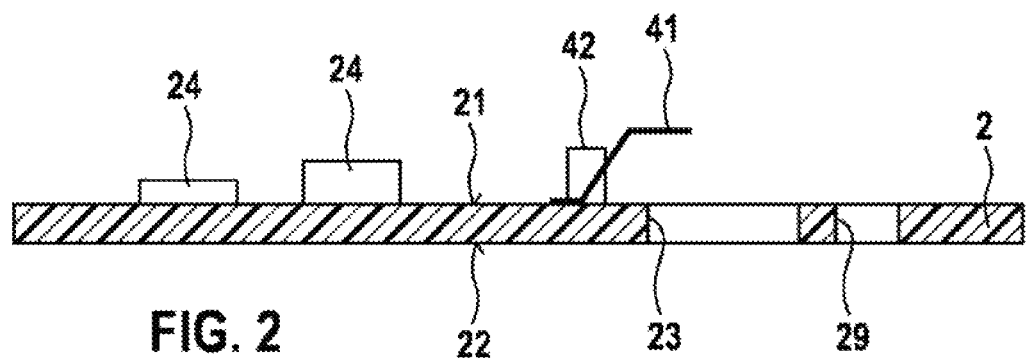
FIGS. 2 to 4 show individual manufacturing steps during production of the electronics module.

Firstly, as shown in FIG. 2, a printed circuit board 2, which has a first side 21 and a second side 22 which is averted from said first side, is populated with electronic components 24 and a contact assembly 42. The electronic components 24 can form, for example, an electronic control circuit and can be mounted onto the printed circuit board 2 and contact-connected using standard processes. These include, for example, adhesive bonding and bonding of bare die components as well as fitting and reflow soldering of enclosed electronic components. The printed circuit board 2 may be a conventional FR4 printed circuit board composed of glass fiber-reinforced epoxy resin with copper conductor tracks which are arranged in one or more layers. The printed circuit board 2 is provided with an aperture 23 which extends starting from the first side 21 to the second side 22. The aperture 23 can be made in the printed circuit board 2, for example, by milling or drilling. The printed circuit board also has, for example, a further recess 29 which is in the form of a bore. Electrical connecting means 41, which can be in the form of a leadframe part, flexible printed circuit board or cable for example, can be arranged on the contact assembly 42. The electronic components 24 and the contact assembly 42 with the electrical connecting means 41 can be soldered, for example in a soldering furnace, to contact areas on the first side 21 of the printed circuit board 2.

Figure 3:
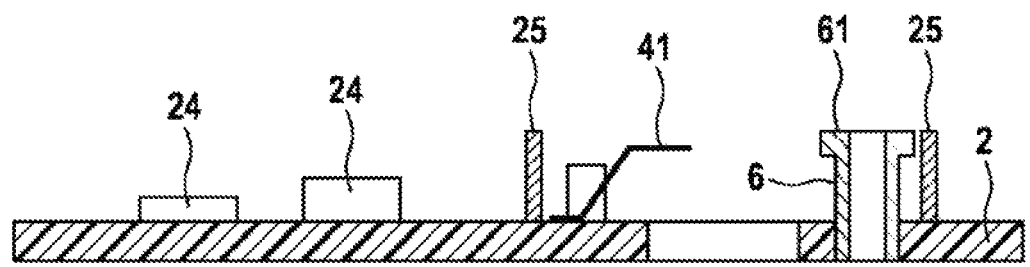
Figure 6:
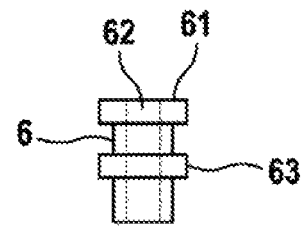
FIG. 6 shows an embodiment of a screw bush which is installed on the electronics module.

As illustrated in FIG. 3, a frame part 25 can be arranged on the first side 21 of the printed circuit board, which frame part surrounds the aperture 23 and the contact assembly 41 in a circumferential manner. The frame part can be produced from metal or plastic or by means of application of a viscous and rapidly curing adhesive. Furthermore, a metal bush 6 can be pressed into the recess 29. The bush 6 has an end side 61 which faces away from the first side 21 of the printed circuit board 2 and from which a receiving opening 62 extends as far as the second side 22 of the printed circuit board 2. In addition to being pressed into the recess 29, the bush 6 can also be soldered to a contact area on the first side of the printed circuit board 2. As shown in FIG. 6, the bush 6 can have a circumferential collar 63 for bearing against the first side 21 of the printed circuit board 2. In the state illustrated in FIG. 2 or FIG. 3, the printed circuit board 2 can be soldered in a soldering furnace.

Figure 4:
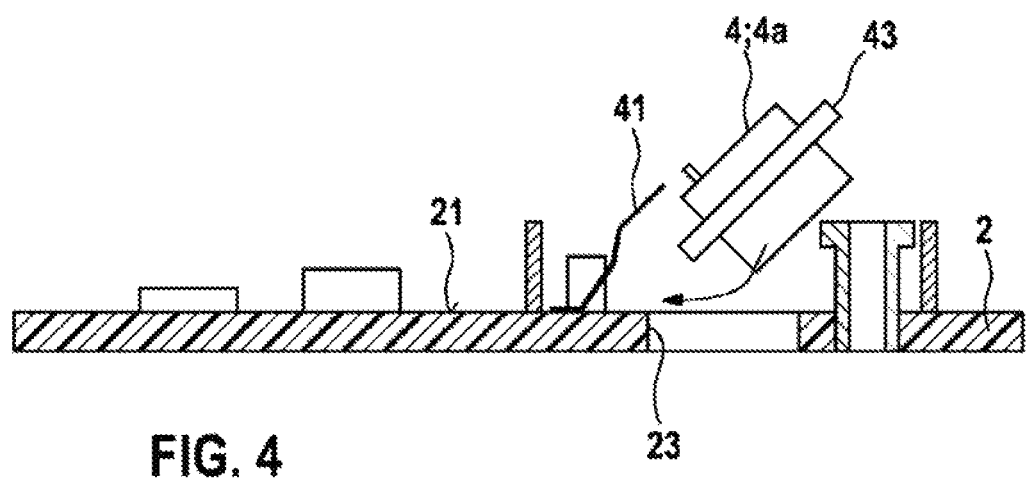

As shown in FIG. 4, a sensor element 4, for example a pressure sensor element 4a, can be inserted into the aperture 23. The sensor element 4 can have a circumferential collar 43 which comes to bear against the edge of the aperture 23 on the first side 21 of the printed circuit board 2. In this case, the sensor element 4 is pushed under the flexible connecting means 41 which can be raised for this purpose. The sensor element 4 preferably completely covers the aperture 23 in order to prevent potting compound from running off through the aperture 23 when potting compound is applied. The electrical contact-connection between the sensor element 4 and the connecting means 4 can take place after the insertion of the sensor element 4, for example by laser welding or using a soldering tip or another selective soldering method. In the same way, at least one or else a plurality of sensor elements 4 can be fitted to the printed circuit board 2.

Figure 1:
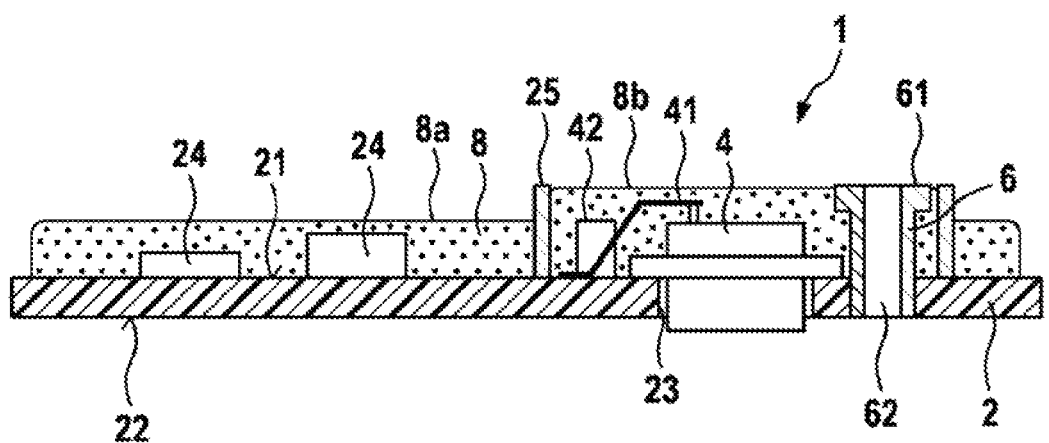
FIG. 1 shows a cross section through an exemplary embodiment of an electronics module according to the disclosure.

Finally, as shown in FIG. 1, a potting compound 8 is applied to the first side 21 of the printed circuit board. To this end, the potting compound 8 can be filled into a first filling region 8a outside the frame part 25 and, at the same time, into a second filling region 8b with a greater filling level within the frame part 25. The potting compound 8 can be applied using a dispensing head. The potting compound 8 can be prevented from running off out of the first filling region 8a by a circumferential barrier, not illustrated, which is arranged on the first side. The potting compound 8 completely covers the electronic components 24, the contact assembly with the connecting means 41, and the sensor element 4 on the first side 21 of the printed circuit board 2. The potting compound 8 can then be cured. Advantageously, no injection-molding die or mold is required. The potting compound 8 used may be a thermosetting plastic, in particular an epoxy resin, for example an epoxy resin with a CTE (CTE=Coefficient of Thermal Expansion) in the range of 18-25 ppm/K. This is suitable for the printed circuit board with a CTE of 18 ppm/K, the sensor element with a steel housing and a CTE of 20 ppm/K, the electronic components 24 and the frame part 25 and the contact assembly 42 composed of thermosetting plastic with a CTE of between 10 and 40 ppm/K, and also the bush 6 composed of steel with a CTE of 20 ppm/K.

Figure 5:
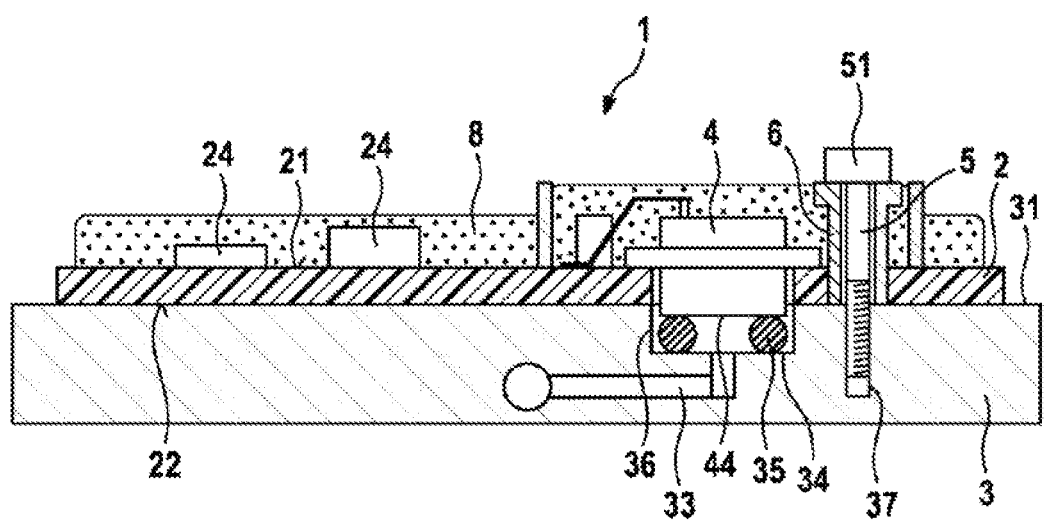
FIG. 5 shows a cross section through an exemplary embodiment of a combination of an electronics module with a hydraulic plate.

The electronics module 1, by way of the second side 22 of the printed circuit board 2, can be, for example, as shown in FIG. 5, placed flat against a planar surface 31 of a hydraulic plate 3 of a vehicle transmission. The hydraulic plate 3 can have a medium channel 33 which issues at the surface 31 of the hydraulic plate 3, for example a hydraulic channel. In this case, the electronics module 1 is fitted on the hydraulic plate in such a way that the medium channel 33 is fluidically connected to the sensor element 4. The medium channel 33 can have a section which is in the form of a depression 36, the base of which has a horizontal projection 34 on which a sealing ring 35 is arranged, which sealing ring is pressed in between a section 44 of the sensor element 4 which protrudes into the aperture 23 and the projection 34. The electronics module 1 can be fixedly screwed into threaded bores 37 of the hydraulic plate 3 by means of screwable connecting means 5, the screw heads 51 of which are supported on the end side 61 of the bush 6. The screwable connecting means 5 push the entire electronics module 1 against the hydraulic plate 3.

A fluid pressure which prevails in the medium channel 33 acts on the sensor element 4, which is in the form of a pressure sensor element 4a, during operation. Since the sensor element 4 is fixedly installed on the electronics module 1 by means of the potting compound 8, the force which is applied to the electronics module 1 is advantageously absorbed by the screwed-on bushes 6.

The invention claimed is:

1. An electronics module for a motor vehicle transmission, comprising:
   a printed circuit board having a first side and a second side which is averted from the first side, the printed circuit board defining an aperture extending completely through the printed circuit board from the first side to the second side;
   a plurality of electronic components arranged on the first side of the printed circuit board;
   a potting compound arranged on the first side of the printed circuit board and covering the plurality of electronic components;
   a sensor element covering the aperture and arranged on the first side of the printed circuit board; and
   a bush configured to receive a screwable connecting device, the bush arranged on the printed circuit board, wherein
   the bush is flanked in a circumferential manner by the potting compound,
   the potting compound is applied to the first side of the printed circuit board, and
   the bush has an end side which is not covered by the potting compound and from which a receiving opening extends as far as the second side of the printed circuit board.

2. The electronics module as claimed in claim 1, wherein:
   the sensor element completely covers the aperture, and
   the sensor element is covered by the potting compound on the first side of the printed circuit board.

3. The electronics module as claimed in claim 1, further comprising:
   at least one electrical connecting device configured to electrically connect the sensor element to the printed circuit board,
   wherein the at least one electrical connecting device is embedded into the potting compound.

4. The electronics module as claimed in claim 1, wherein the sensor element is inserted into the aperture.

5. The electronics module as claimed in claim 1, wherein the sensor element has a circumferential collar configured to rest on the first side of the printed circuit board at an edge of the aperture.

6. The electronics module as claimed in claim 1, wherein the sensor element is a pressure sensor element.

7. The electronics module as claimed in claim 1, further comprising:
   a frame part configured to surround the sensor element and located on the first side of the printed circuit board,
   wherein the potting compound is applied within the frame part to the first side of the printed circuit board with a greater filling level than in a region outside the frame part.

* * * * *